United States Patent
Nygren et al.

(10) Patent No.: US 6,701,473 B2
(45) Date of Patent: Mar. 2, 2004

(54) ELECTRICAL CIRCUIT AND METHOD FOR TESTING A CIRCUIT COMPONENT OF THE ELECTRICAL CIRCUIT

(75) Inventors: Aaron Nygren, München (DE); Eckehard Plättner, München (DE); Andreas Täuber, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 556 days.

(21) Appl. No.: 09/771,391

(22) Filed: Jan. 26, 2001

(65) Prior Publication Data

US 2002/0008538 A1 Jan. 24, 2002

(30) Foreign Application Priority Data

Jan. 26, 2000 (DE) ........................ 100 03 260
Mar. 31, 2000 (DE) ........................ 100 16 127

(51) Int. Cl.[7] ............... G01R 31/3177; G01R 31/3185; G06F 11/267
(52) U.S. Cl. ..................................... 714/724
(58) Field of Search ........................ 714/724

(56) References Cited

U.S. PATENT DOCUMENTS

| | | | |
|---|---|---|---|
| 5,136,185 A | 8/1992 | Fleming et al. | |
| 5,841,968 A | 11/1998 | Caldera et al. | |
| 6,041,427 A | * 3/2000 | Levy | ........... 714/724 |
| 6,499,124 B1 | * 12/2002 | Jacobson | ........... 714/727 |
| 2001/0049806 A1 | * 12/2001 | Porteners et al. | ........... 714/724 |

FOREIGN PATENT DOCUMENTS

| | | | | |
|---|---|---|---|---|
| EP | 364925 A1 | * 4/1990 | ........ | G01R/31/318 |
| EP | 0 517 269 A2 | 12/1992 | | |
| EP | 0 558 231 A2 | 9/1993 | | |
| JP | 01 266 635 | 10/1989 | | |
| JP | 04 138 388 A | 5/1992 | | |
| JP | 11 248 802 | 9/1999 | | |

OTHER PUBLICATIONS

A. Auer et al.: "Schaltungstest mit Boundary Scan" [circuit testing with boundary scan], Hüthig Verlag, Heidelberg, pp. 46–70.
U. Tietze et al.: "Halbleiter–Schaltungstechnik" [semiconductor circuit technology], Springer Verlag, Berlin, 8th ed., 1986, pp. 207, 635–637, and English translation thereof.

* cited by examiner

Primary Examiner—R. Stephen Dildine
(74) Attorney, Agent, or Firm—Laurence A. Greenberg; Werner H. Stemer; Ralph E. Locher

(57) ABSTRACT

The electrical circuit includes a plurality of circuit components which are connected via a bus. At least one of the circuit components can be tested independently of the other circuit components. The circuit component which is to be tested and the method for testing the circuit component are distinguished in that steps are taken to ensure that, during testing, the circuit component which is tested, outputs no data to the bus, and/or instead of the data which would need to be output to the bus during normal operation, outputs other data to the bus.

38 Claims, 2 Drawing Sheets

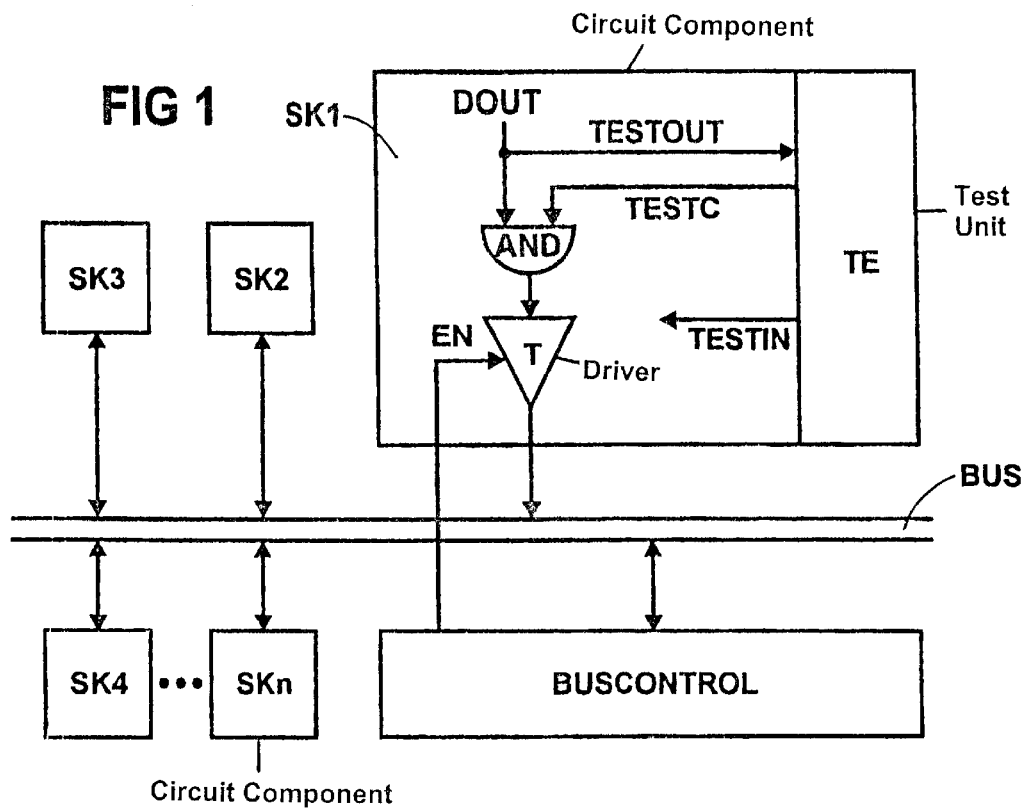
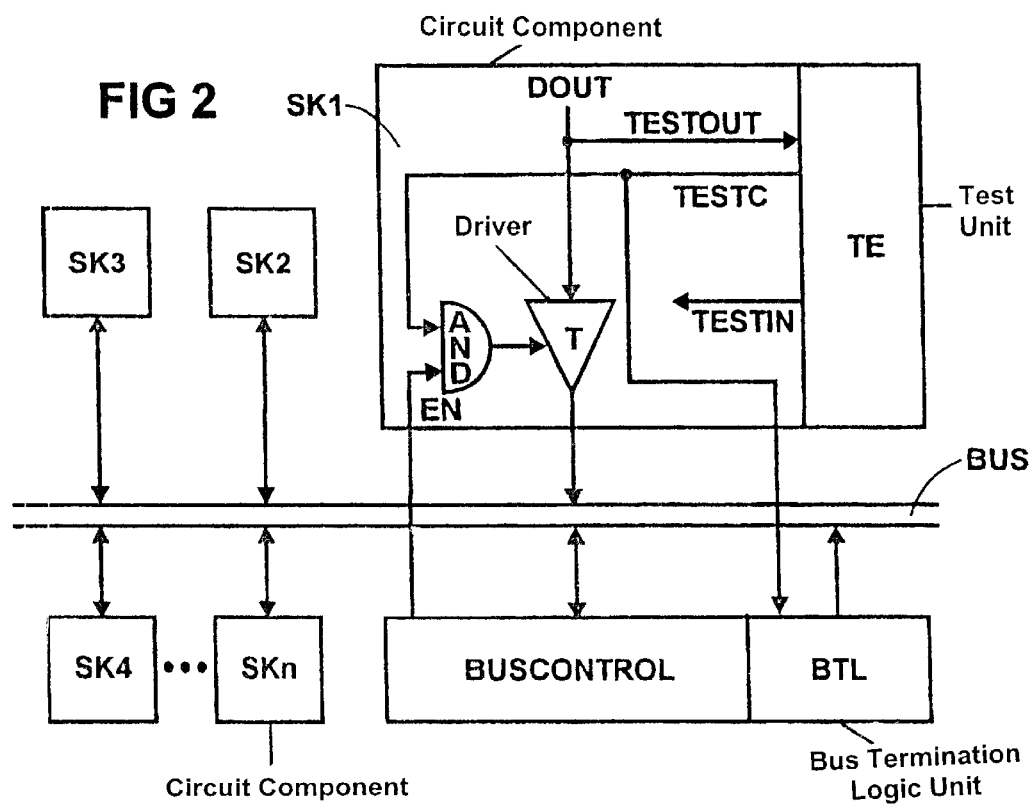

ELECTRICAL CIRCUIT AND METHOD FOR TESTING A CIRCUIT COMPONENT OF THE ELECTRICAL CIRCUIT

BACKGROUND OF THE INVENTION

Field of the Invention

The present invention relates to an electrical circuit having circuit components that are connected through a bus where at least one of the circuit components can be tested independently of the other circuit components. Additionally, the present invention relates to a method for testing a circuit component that is connected to other circuit components through a bus, where the circuit component that is to be tested, can be tested independently of the other circuit components.

The circuit component that is to be tested is, by way of example, a so-called macro of an integrated circuit. When testing an integrated circuit, particular macros need or are intended to be tested individually, i.e. independently of the other circuit components of the integrated circuit.

Although only a relatively small part of the integrated circuit is tested during such tests, such tests are frequently relatively complex, particularly on account of the very high currents that can flow through the integrated circuit during testing, and on account of the associated extreme evolution of heat. For the aforementioned reasons, unreliable test results are sometimes also obtained.

SUMMARY OF THE INVENTION

It is accordingly an object of the invention to provide an electrical circuit having circuit components that are connected through a bus and a method of testing at least one of the circuit components independently of the other circuit components which overcomes the above-mentioned disadvantageous of the prior art electrical circuits and methods of this general type, and in which the circuit components that are to be tested, can be reliably tested with a minimum amount of effort.

With the foregoing and other objects in view there is provided, in accordance with the invention an electrical circuit that includes a bus; and a plurality of circuit components which are connected via the bus. At least one of the plurality of circuit components defines a circuit component to be tested and is configured to be tested independently from all others of the plurality of circuit components. The circuit component to be tested is configured to perform an operation, during the testing thereof, that is selected from the group consisting of outputting no data to the bus, and outputting data to the bus that is other than data which would be output to the bus during normal operation.

With the foregoing and other objects in view there is also provided, in accordance with the invention, a method for testing a circuit component which is connected to other circuit components via a bus. The method includes a step of providing a plurality of circuit components that are connected to a bus. At least one of the plurality of circuit components is configured such that it can be tested independently from all others of the plurality of circuit components, where the at least one of the plurality of circuit components defines a circuit component to be tested. While testing the circuit component to be tested, an operation is performed, with the circuit component to be tested. The operation is selected from the group consisting of outputting no data to the bus, and outputting data to the bus that is other than data which would be output to the bus during normal operation.

Accordingly, the electrical circuit and the method are distinguished in that, during testing, the at least one circuit component which can be tested independently of the other circuit components outputs no data to the bus and/or, instead of the data which would need to be output to the bus during normal operation, outputs other data to the bus (characterizing part of patent claim 1), and in that steps are taken to ensure that, during testing, the circuit component which is to be tested outputs no data to the bus and/or, instead of the data which would need to be output to the bus during normal operation, outputs other data to the bus (characterizing part of patent claim 2).

By providing these features it is possible to ensure that the output drivers of the circuit component which is to be tested do not consume any power at all or only very little power. This is plausible for the case in which the circuit component which is to be tested outputs no data to the bus, but also applies to the case in which data are output to the bus. This is because the data which, if at all, are output to the bus by the circuit component which is tested, while it is being tested, are not the data which would be output to the bus by the tested circuit component during normal operation. The data can therefore be selected and output such that the power consumption of the output drivers is minimal.

The output drivers have a low power consumption when, amongst other things, the data which are to be output to the bus do not change or change only infrequently. The reason for this is that, in this case, the bus lines, which can have a considerable capacity and which may require relatively high currents for reloading them, particularly at high clock frequencies, need not be reloaded or need be reloaded only infrequently. Reloading of the bus lines, which is necessary infrequently or is not necessary at all, has the positive effect that the output drivers need never or need only infrequently deliver high currents. The effect achieved by this, in turn, is that, during testing, the relevant circuit component does not become nearly as hot as would be the case without the inventive measures regarding the absence of output data or the limitation on the output data.

A low power consumption by the output drivers and the associated advantages can also be achieved by providing, additionally or alternatively, for the data which need to be output to the bus to be able to be output so as to bypass the output drivers during testing. The output drivers can then be switched off or deactivated during testing.

The fact that, while it is being tested, the tested circuit component does not output data to the bus, and/or that it outputs data other than data which is output in the normal case, does not affect the test result. The circuit component which is to be tested is, of course, intended to be tested independently of the other circuit components, which means that it is not necessary for data interchange between the circuit components of the electrical circuit to take place via the bus.

The electrical circuit and the method therefore make it possible for circuit components, which are to be tested, to be reliably tested with a minimum amount of effort.

In accordance with an added feature of the invention, the circuit component to be tested includes output drivers for outputting data to the bus, the output drivers being deactivated during testing of the circuit component to be tested.

In accordance with an additional feature of the invention, the output drivers are deactivated by a test unit which is testing the circuit component to be tested.

In accordance with an another feature of the invention, a device is provided that is selected from the group consisting of a logic unit and a selection circuit. The device is for deactivating the output drivers. The device ensures: that during normal operation of the circuit component to be tested, the output drivers are controlled based upon an enable signal which is supplied to the circuit component to be tested by a bus control device which controls the bus, and that during testing of the circuit component to be tested, the output drivers are controlled based upon a test control signal which the test unit supplies to the circuit component to be tested.

In accordance with a further feature of the invention, the device is the logic unit, and the logic unit provides an output signal resulting from a logical combination of the enable signal and a test control signal.

In accordance with a further added feature of the invention, the device is selected to be the selection circuit, the output drivers include control connections, and the selection circuit is formed by a multiplexer which selectively connects the enable signal or the test control signal to the control connections of the output driver.

In accordance with a further additional feature of the invention, a bus control device is provided for controlling the bus and for receiving a signal indicating testing of the circuit component to be tested.

In accordance with yet an added feature of the invention, during testing of the circuit component to be tested, the bus control device ensures that the bus is terminated by a device selected from the group consisting of the bus control device and one of the others of the plurality of circuit components.

In accordance with yet an additional feature of the invention, the operation performed by the circuit component to be tested, during the testing thereof, is outputting data to the bus that is other than the data which would be output to the bus during normal operation, and the data outputted to the bus is data selected from the group consisting of infrequently changing data and non-changing data.

In accordance with yet another feature of the invention, a device is provided that is selected from the group consisting of a logic unit and a selection circuit. The device ensures: that during normal operation of the circuit component to be tested, data that actually needs to be output to the bus are output to the bus, and that during testing of the circuit component to be tested, the data outputted to the bus is from a test unit carrying out the testing of the circuit component to be tested.

In accordance with yet a further feature of the invention, the device is selected to be the logic unit. The logic unit provides an output signal resulting from a logical combination of the data which would be output to the bus during normal operation and a test control signal. The test unit uses the test control signal to indicate that it is currently testing the circuit component to be tested.

In accordance with yet a further added feature of the invention, the device is selected to be the selection circuit. The circuit component to be tested includes output drivers for outputting data to the bus, and the selection circuit is formed by a multiplexer which selectively connects to the output drivers either the data which would be output to the bus during normal operation or the test control signal supplied by the test unit.

In accordance with yet a further additional feature of the invention, the circuit component to be tested includes output drivers for outputting data to the bus, and each one of the output drivers is provided with a device that is selected from the group consisting of a logic unit and a selection circuit.

In accordance with an added feature of the invention, each one of the output drivers receives an input signal that is an output signal of the respectively provided device.

In accordance with an additional feature of the invention, the circuit component to be tested includes output drivers with output connections; the operation performed by the circuit component to be tested, during testing thereof, is outputting data to the bus that is other than data which would be output to the bus during normal operation; and the outputted data are supplied to points situated between the output connections of the output drivers and the bus.

In accordance with another feature of the invention, a switching device is provided for supplying the outputted data to the points situated between the output connections of the output drivers and the bus.

In accordance with a further feature of the invention, a logic unit is provided for controlling the switching device.

In accordance with yet a further feature of the invention, the logic unit provides an output signal resulting from a logical combination of an enable signal and a test control signal.

In accordance with a concomitant feature of the invention, the switching device, when turned on, connects the points situated between the output connections of the output drivers and the bus to at least one point which has a predetermined potential.

Other features which are considered as characteristic for the invention are set forth in the appended claims.

Although the invention is illustrated and described herein as embodied in an electrical circuit and method for testing a circuit component of the electrical circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a first illustrative embodiment of the inventive electrical circuit;

FIG. 2 shows a second illustrative embodiment of the electrical circuit; and

DESCRIPTION OF THE PREFERRED EMBODIMENTS

Figure 3:
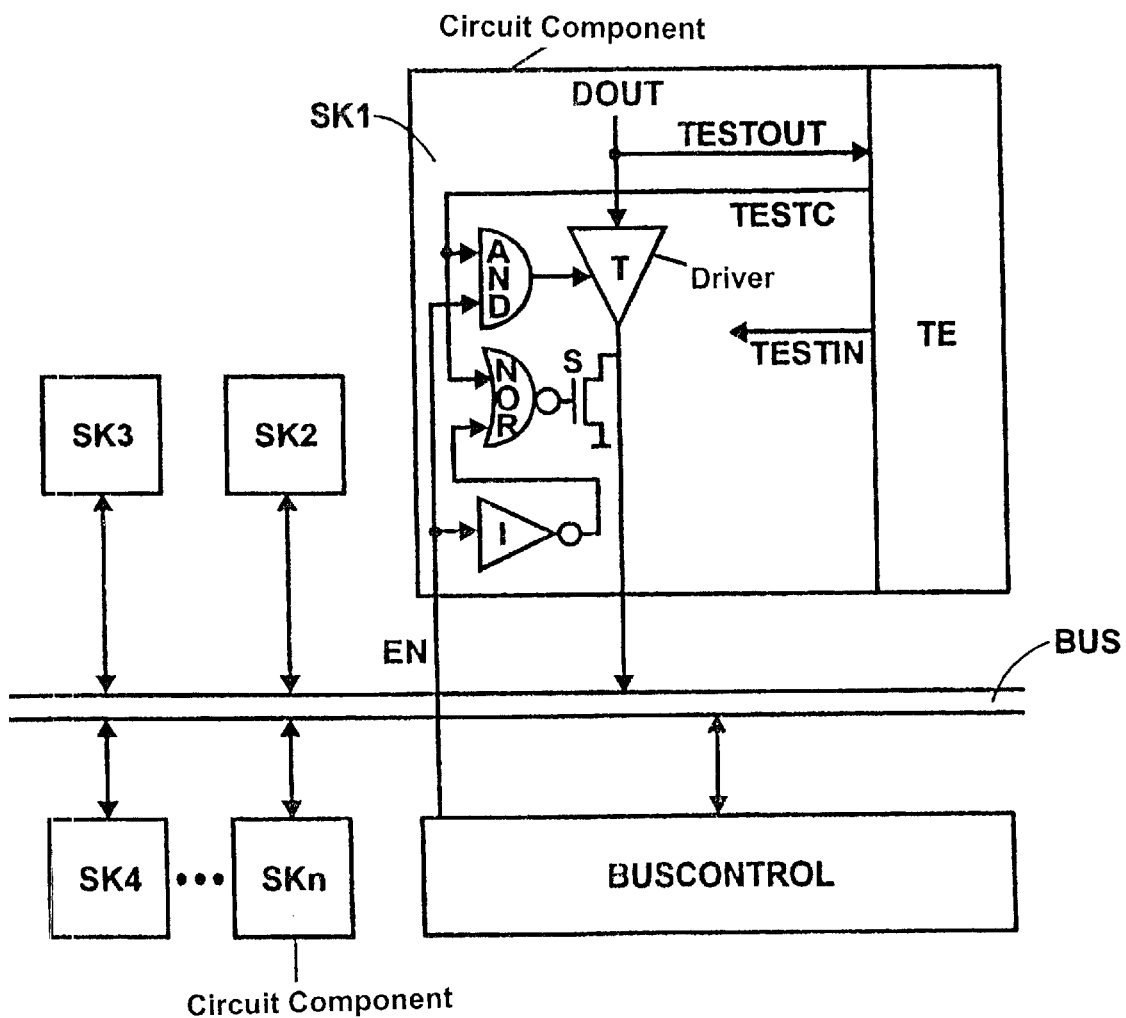
FIG. 3 shows a third illustrative embodiment of the electrical circuit.

The electrical circuit described below is an integrated circuit. However, before continuing, it should be pointed out that there is no restriction to this. The electrical circuit may also be any other electrical circuit.

Referring now to the figures of the drawing in detail and first, particularly, to FIG. 1 thereof, there is shown a first illustrative embodiment of an inventive electrical circuit.

The electrical circuit shown in FIG. 1 includes circuit components (macros) SK1, SK2, . . . SKn, a bus "BUS" which connects the circuit components SK1, SK2, . . . SKn, and a bus control device BUSCONTROL which handles the control (in particular the arbitration) of the bus "BUS".

The circuit components SK1, SK2, . . . SKn include at least one circuit component which can be tested individually, i.e. independently of the other circuit components of the electrical circuit.

In the example under consideration, this circuit component is the circuit component denoted by the reference symbol SK1.

In the example under consideration, the circuit component SK1 is a memory module, more precisely a DRAM macro. However, before continuing, it should be pointed out that there is no restriction to this. The testable circuit component as described below may also be any other circuit component.

For testing the circuit component SK1, a test unit TE is provided. In the example under consideration, this test unit is a component part of the circuit component SK1 which is to be tested. However, there is no restriction to this either. The test unit TE may also be provided outside the circuit component SK1 which is to be tested; in this context, it may be provided at random points within the electrical circuit, or else outside the electrical circuit.

The test unit TE
- inputs test data TESTIN into the circuit component SK1 which is to be tested,
- outputs test data TESTOUT from the circuit component SK1 which is to be tested,
- uses a test control signal TESTC to control the circuit component SK1 which is to be tested, and
- uses the test data TESTIN and TESTOUT to check whether the circuit component SK1 which is to be tested is operating correctly.

During normal operation of the circuit component SK1, that is to say when and so long as the circuit component SK1 is not being tested,
- data are supplied to the circuit component SK1 via the bus "BUS" and a data reception apparatus (not shown in FIG. 1), and
- the circuit component SK1 outputs data to the bus "BUS" via a multiplicity of output drivers, of which only a single output driver T is shown in FIG. 1.

In the example under consideration, the output drivers T are so-called tristate drivers and are activated and deactivated by the bus control device BUSCONTROL, more precisely by an enable signal EN output by the latter. When the output drivers T are activated, which may be the case when EN=1 in the example under consideration, they output the data supplied to them to the bus "BUS". When the output drivers T are deactivated, which may be the case when EN=0 in the example under consideration, they cannot output any data to the bus "BUS"; they are then in a high-impedance state.

During testing of the circuit component SK1,
- the test data TESTIN from the test unit TE are used by the circuit component SK1 instead of the data supplied to it via the bus "BUS",
- the data normally output to the bus "BUS" are used as test data TESTOUT for the test unit TE, and
- instead of the data normally output to the bus "BUS", other data are output to the bus.

In the example under consideration, the data which are output to the bus "BUS" while the circuit component SK1 is being tested are generated independently of the data which actually need to be output to the bus; they have the special feature that they do not change or change only very infrequently.

In the example under consideration, data which represent the level "0" are continuously output to the bus "BUS" while the circuit component SK1 is being tested.

In the example under consideration, when which data are output to the bus "BUS" is determined by a logic unit connected upstream of the output drivers T.

In the example under consideration, this logic unit includes an AND gate AND which receives as input signals the data DOUT which need to be output to the bus "BUS" during normal operation of the circuit component SK1 and the test control signal TESTC, and whose output signal is supplied to the output driver T as input signal.

During normal operation of the circuit component SK1, the test control signal TESTC has the value "1". The result of this is that the output signal from the AND gate is equivalent to the input signal DOUT of the AND gate. This means that, during normal operation of the circuit component SK1, the data DOUT which actually need to be output to the bus "BUS" are output to the bus.

During testing of the circuit component SK1, the test control signal has the value "0". The result of this is that the output signal from the AND gate has the value "0", irrespective of the value of the other input signal of the AND gate. This means that the value "0" is continuously output to the bus while the circuit component SK1 is being tested.

The fact that, while it is being tested, the circuit component SK1 outputs data which never change or change only infrequently to the bus "BUS" has the positive effect that the bus lines need never be reloaded or need be reloaded only infrequently. This is advantageous because
- the output drivers T consequently consume only relatively little power, and
- the output drivers T and hence also the circuit component SK1 do not heat up excessively.

The low power consumption of the electrical circuit during testing and the relatively low temperature of the electrical circuit during testing mean that the circuit component SK1 which is to be tested can be reliably tested with a minimum of effort. In particular, it means that
- the number and size of the elements (needles) used to supply the electrical circuit with power during testing can be kept small, and
- it is a comparatively simple matter to carry out low-temperature tests.

The fact that the data DOUT which actually need to be output to the bus "BUS" are not output to the bus while the circuit component SK1 is being tested, but instead other data are output to the bus, has no negative effect on the test result. The circuit component SK1 which is to be tested is, of course, intended to be tested independently of the other circuit components of the electrical circuit, so that it is unimportant whether, and possibly which, data are output to the bus by the circuit component SK1.

The fact that the circuit component SK1 outputs data to the bus "BUS" is nevertheless found to be advantageous. If the circuit component SK1 were to automatically deactivate its output drivers (put them into the high-impedance state) during testing, this could lead to problems. In general, this is because the components connected to the bus "BUS" are not intended to (must not) ever, or possibly only to briefly, have all of the output drivers put into the high-impedance state at the same time. The bus "BUS" is intended to (must) be continually terminated by precisely one of the components which are connected to it.

This problem does not arise in the present case, however. This means that the bus control device BUSCONTROL can continue to operate unchanged while the circuit component SK1 is being tested, and can retain exclusive control via the bus "BUS". This in turn makes it possible for a plurality of circuit components of the electrical circuit to be tested at the same time.

It ought to be clear that it is not imperative for data continuously representing the level "0" to be output to the bus "BUS" while the circuit component SK1 is being tested. Data continuously representing the level "1" can also be output to the bus "BUS". Furthermore, provision may be made for data which do not continuously have one predetermined level, but instead change, to be output to the bus "BUS" while the circuit component SK1 is being tested. In this case, the important factor is that the data which are output to the bus change only relatively infrequently, and thus it is essentially possible to attain the same advantageous effects as in the case when data which do not change are output to the bus.

It should likewise be clear that the logic unit used to generate the data which need to be output to the bus does not necessarily have to be an AND gate AND of the design and arrangement described. There are innumerable other options for this: by way of example, a NAND gate may be used instead of the AND gate AND. As another example, a multiplexer can be used to selectively connect, to the output driver T, the data DOUT which need to be output during normal operation or data which need to be output during testing.

The electrical circuit can alternatively be designed such that, while it is being tested, the circuit component which is to be tested outputs no data to the bus.

An illustrative embodiment of such an electrical circuit is shown in FIG. 2 and is described below with reference thereto.

The electrical circuit shown in FIG. 2 is largely consistent with the electrical circuit shown in FIG. 1. Like the electrical circuit shown in FIG. 1, it (the electrical circuit shown in FIG. 2) includes circuit components (macros) SK1, SK2, ... SKn, a bus "BUS" which connects the circuit components SK1, SK2, ... SKn, and a bus control device BUSCONTROL which handles the control (in particular the arbitration) of the bus "BUS". Of the circuit components present SK1, SK2, ... SKn, the intention is also again for the circuit component denoted by the reference symbol SK1 to be tested individually, i.e. independently of the other circuit components of the electrical circuit. The circuit component which is to be tested is tested by a test unit TE which, like the test unit TE provided in the electrical circuit shown in FIG. 1, is contained in the circuit component which is to be tested, i.e. the circuit component SK1. To this extent, the electrical circuit shown in FIG. 2 is equivalent to the electrical circuit shown in FIG. 1.

Unlike the circuit component SK1 shown in FIG. 1, however, the circuit component SK2 shown in FIG. 2 outputs no data to the bus "BUS" while it is being tested.

In the example under consideration, this is achieved in that the (control) connections of the output drivers T (which are also present in the circuit component SK1 shown in FIG. 2), which connections can be used to activate and deactivate the output drivers, no longer have the enable signal EN which is output by the bus control device BUSCONTROL applied to them, but instead have the output signal from a logic unit connected upstream of the control connection applied to them.

In the example under consideration, this logic unit includes an AND gate AND which receives as input signals, the enable signal EN and the test control signal TESTC which is also provided in the electrical circuit shown in FIG. 2. The output signal of the AND gate AND is used to control the output drivers T.

During normal operation of the circuit component SK1, the test control signal TESTC has the value "1". The result of this is that, during normal operation of the circuit component SK1, the signal used to control the output drivers corresponds to the enable signal EN.

During testing of the circuit component SK1, the test control signal has the value "0". The result of this is that the signal used to control the output drivers T continuously has the value "0" while the circuit component SK1 is being tested, as a result of which the output drivers T are deactivated and cannot output data to the bus "BUS".

Unlike in the electrical circuit shown in FIG. 1, in the electrical circuit shown in FIG. 2, the test control signal TESTC is not supplied only to the circuit component SK1 which is to be tested, but also to a bus termination logic unit BTL, which is a component part of the bus control device BUSCONTROL in the example under consideration.

The bus termination logic unit BTL ensures that, during testing of the circuit component SK1 (when and so long as the test control signal TESTC is signaling that the circuit component SK1 is currently being tested), the bus "BUS" is terminated by one of the other components connected to the bus "BUS". In the example under consideration, the bus termination logic unit BTL terminates the bus "BUS" itself if required. Alternatively, provision could be made for the bus termination logic unit BTL to activate the output drivers of one of the other circuit components connected to the bus "BUS" while the circuit component SK1 is being tested, and for it then to have these circuit components terminate the bus.

It ought to be clear that the logic unit used to generate the control signal for controlling the output drivers T need not necessarily be an AND gate AND of the design and arrangement described. There are innumerable other options for this: by way of example, a NAND gate may be used instead of the AND gate AND, or else a multiplexer which is used to selectively connect the enable signal EN or the test control signal TESTC to the control connection of the output drivers T.

The fact that no data are output to the bus "BUS" while the circuit component SK1 is being tested has the positive effect that the output drivers T have no or only a negligibly low power consumption and consequently do not heat up at all, or heat up only to a very small extent.

The low power consumption of the electrical circuit during testing and the relatively low temperature of the electrical circuit during testing mean that the circuit component SK1 which is to be tested can be reliably tested with a minimum of effort. In particular, this means that the number and size of the elements (needles) used to supply the electrical circuit with power during testing can be kept small, and it is a comparatively simple matter to carry out low-temperature tests.

These advantages are even more pronounced in the electrical circuit shown in FIG. 2 than is the case in the electrical circuit shown in FIG. 1.

The electrical circuit shown in FIG. 3 and described below with reference thereto permits the advantage of the electrical circuit shown in FIG. 1, namely that, during testing of the circuit component which is to be tested, the bus is terminated, as may be necessary, by the actual circuit component which is to be tested, to be combined with the advantage of the electrical circuit shown in FIG. 2, namely that the output drivers of the circuit component which is to be tested have no or only a negligibly low power consumption while the circuit component is being tested.

The electrical circuit shown in FIG. 3 is largely consistent with the electrical circuits shown in FIGS. 1 and 2. Like the electrical circuits shown in FIGS. 1 and 2, it (the electrical circuit shown in FIG. 3) includes circuit components (macros) SK1, SK2, . . . SKn, a bus "BUS" which connects the circuit components SK1, SK2, . . . SKn, and a bus control device BUSCONTROL which handles the control (in particular the arbitration) of the bus "BUS". Of the circuit components present SK1, SK2, . . . SKn, the intention is also again for the circuit component denoted by the reference symbol SK1 to be tested individually, i.e. independently of the other circuit components of the electrical circuit. The circuit component which is to be tested is tested by a test unit TE which, like the test unit TE provided in the electrical circuits shown in FIGS. 1 and 2, is contained in the circuit component which is to be tested, i.e. the circuit component SK1. To this extent, the electrical circuit shown in FIG. 3 is equivalent to the electrical circuits shown in FIGS. 1 and 2.

Like the circuit component SK1 shown in FIG. 1 and by contrast with the circuit component SK1 shown in FIG. 2, the circuit component SK1 shown in FIG. 3 outputs data to the bus "BUS" as required (particularly when the circuit component SK1 is determined by the bus control device BUSCONTROL as bus master) while the circuit component SK1 is being tested.

In the example under consideration, however, this is done not by means of the output drivers T, which are also present for the circuit component SK1 shown in FIG. 3, but rather by applying a predetermined potential or potential profile to points situated between the output connections of the output drivers T and the bus "BUS".

In the example under consideration, the predetermined potential is ground potential. It may also be any other potential and also a potential which changes over time, however.

In the example under consideration, a predetermined potential or potential profile is applied to the points situated between the output connections of the output drivers T and the bus "BUS" by means of a switching device S, which in the present case is formed by a transistor. In this context, it is basically unimportant what type of transistor this is. Instead of the transistor, any other switching device may also be used, for example a so-called transmission gate.

The switching device S is controlled by a logic unit. In the example under consideration, this logic unit includes a NOR gate NOR and an inverter I, with the NOR gate NOR receiving a test control signal TESTC and an enable signal EN inverted by the inverter I as input signals, and the output signal from the NOR gate NOR being used to control the switching device S.

The test control signal TESTC and the enable signal EN are consistent with the signals of the same name in the electrical circuits shown in FIGS. 1 and 2.

The output drivers T of the circuit component SK1 which is to be tested are deactivated while the circuit component is being tested. In the example under consideration, this is achieved in that the (control) connections of the output drivers T, which connections can be used to activate and deactivate the output drivers, have the output signal from a logic unit which is connected upstream of the control connection applied to them, as in the case of the electrical circuit shown in FIG. 2.

In the example under consideration, as in the case of the electrical circuit shown in FIG. 2, this logic unit includes an AND gate AND which receives the test control signal TESTC and the enable signal EN as input signals, and whose output signal is used to control the output drivers T.

The switching device S, which controls the termination of the bus "BUS", and the output drivers T are controlled by the logic units AND and I/NOR such that the following conditions are established as a result:

| TESTC | EN | Action |
|---|---|---|
| 0 | 0 | Test mode |
|   |   | Output drivers deactivated |
|   |   | Termination inactive |
| 0 | 1 | Test mode |
|   |   | Output drivers deactivated |
|   |   | Termination active |
| 1 | 0 | Normal operation |
|   |   | Output drivers deactivated |
| 1 | 1 | Normal operation |
|   |   | Output drivers activated |

The electrical circuit shown in FIG. 3 has the advantages, as compared with the electrical circuit shown in FIG. 1, that the path via which the data DOUT are output during normal operation contains no additional logic unit, which means that data can be output more quickly, and that the output drivers are deactivated during testing of the circuit component which is to be tested, which means that they consume less power during testing and consequently also heat up to a lesser extent, and has the advantage, as compared with the electrical circuit shown in FIG. 2, that the circuit component which is to be tested terminates the bus itself, which means that it is possible to dispense with the bus termination logic unit BTL or similar devices.

Furthermore, this is achieved without having to accept significant disadvantages as compared with the electrical circuits shown in FIGS. 1 and 2.

It ought to be clear that the logic units used to generate the control signals for controlling the output drivers T and the switching device S need not necessarily be designed and arranged as described. There are innumerable other options for this.

The fact that the output drivers T are deactivated while the circuit component SK1 is being tested has the positive effect that they have no or only a negligibly low power consumption and consequently do not heat up at all or heat up only to a very small extent.

The low power consumption of the electrical circuit during testing and the relatively low temperature of the electrical circuit during testing mean that the circuit component SK1 which is to be tested can be reliably tested with a minimum of effort. In particular, it means that the number and size of the elements (needles) used to supply the electrical circuit with power during testing can be kept small, and it is a comparatively simple matter to carry out low-temperature tests.

The precautions taken for testing the circuit component which is to be tested do not in any way impair it during normal operation. In particular, there is no need for concern about any kind of effects on the operating speed and the other essential properties of the circuit component which is to be tested.

A common feature of the electrical circuits described, independently of the details of the practical implementation, is that they provide an amazingly simple way of reliably testing circuit components which are to be tested with a minimum of effort.

We claim:

1. An electrical circuit comprising:
   a bus; and
   a plurality of circuit components which are connected via said bus, at least one of said plurality of circuit components defining a circuit component to be tested and configured to be tested independently from all others of said plurality of circuit components;
   said circuit component to be tested configured to perform an operation, during testing thereof, that is selected from the group consisting of outputting no data to said bus, and outputting data to said bus that is other than data which would be output to said bus during normal operation.

2. The electrical circuit according to claim 1, wherein said circuit component to be tested includes output drivers for outputting data to said bus, said output drivers being deactivated during testing of said circuit component to be tested.

3. The electrical circuit according to claim 2, wherein said output drivers are deactivated by a test unit which is testing said circuit component to be tested.

4. The electrical circuit according to claim 3, comprising a device selected from the group consisting of a logic unit and a selection circuit, said device for deactivating said output drivers, said device ensuring:
   that during normal operation of said circuit component to be tested, said output drivers are controlled based upon an enable signal which is supplied to said circuit component to be tested by a bus control device which controls said bus, and
   that during testing of said circuit component to be tested, said output drivers are controlled based upon a test control signal which the test unit supplies to said circuit component to be tested.

5. The electrical circuit according to claim 4, wherein said device is said logic unit, said logic unit providing an output signal resulting from a logical combination of the enable signal and a test control signal.

6. The electrical circuit according to claim 4, wherein said device is said selection circuit, said output drivers include control connections, and said selection circuit is formed by a multiplexer which selectively connects the enable signal or the test control signal to said control connections of said output driver.

7. The electrical circuit according to claim 1, comprising a bus control device for controlling said bus and for receiving a signal indicating testing of said circuit component to be tested.

8. The electrical circuit according to claim 7, wherein, during testing of said circuit component to be tested, said bus control device ensures that said bus is terminated by a device selected from the group consisting of said bus control device and one of said others of said plurality of circuit components.

9. The electrical circuit according to claim 1, wherein the operation performed by said circuit component to be tested, during the testing thereof, is outputting data to said bus that is other than the data which would be output to said bus during normal operation, and the data outputted to said bus is data selected from the group consisting of infrequently changing data and non-changing data.

10. The electrical circuit according to claim 9, comprising a device selected from the group consisting of a logic unit and a selection circuit, said device ensuring:
    that during normal operation of said circuit component to be tested, data that actually needs to be output to said bus are output to said bus, and
    that during testing of said circuit component to be tested, the data outputted to said bus is from a test unit carrying out the testing of said circuit component to be tested.

11. The electrical circuit according to claim 10, wherein said device is said logic unit, said logic unit providing an output signal resulting from a logical combination of the data which would be output to said bus during normal operation and a test control signal, said test unit using said test control signal to indicate that it is currently testing said circuit component to be tested.

12. The electrical circuit according to claim 10, wherein said device is said selection circuit, said circuit component to be tested includes output drivers for outputting data to said bus, said selection circuit is formed by a multiplexer which selectively connects to said output drivers either the data which would be output to said bus during normal operation or said test control signal supplied by said test unit.

13. The electrical circuit according to claim 10, wherein said circuit component to be tested includes output drivers for outputting data to said bus, and each one of said output drivers is provided with a device that is selected from the group consisting of a logic unit and a selection circuit.

14. The electrical circuit according to claim 13, wherein each one of said output drivers receives an input signal that is an output signal of said respectively provided device.

15. The electrical circuit according to claim 1, wherein:
    said circuit component to be tested includes output drivers with output connections;
    the operation performed by said circuit component to be tested, during testing thereof, is outputting data to said bus that is other than data which would be output to said bus during normal operation; and
    the outputted data are supplied to points situated between said output connections of said output drivers and said bus.

16. The electrical circuit according to claim 15, comprising a switching device for supplying the outputted data to said points situated between said output connections of said output drivers and said bus.

17. The electrical circuit according to claim 16, comprising a logic unit for controlling said switching device.

18. The electrical circuit according to claim 17, wherein said logic unit provides an output signal resulting from a logical combination of an enable signal and a test control signal.

19. The electrical circuit according to claim 16, wherein said switching device, when turned on, connects said points situated between said output connections of said output drivers and said bus to at least one point which has a predetermined potential.

20. A method for testing a circuit component which is connected to other circuit components via a bus, the method which comprises:
    providing a plurality of circuit components that are connected to a bus;
    configuring at least one of the plurality of circuit components such that it can be tested independently from all others of said plurality of circuit components, the at least one of the plurality of circuit components defining a circuit component to be tested; and
    while testing the circuit component to be tested, performing an operation with the circuit component to be tested, the operation selected from the group consisting of outputting no data to the bus, and outputting data to the bus that is other than data which would be output to the bus during normal operation.

21. The method according to claim 20, which comprises:
providing the circuit component to be tested with output drivers for outputting data to the bus; and
deactivating the output drivers during testing of the circuit component to be tested.

22. The method according to claim 21, which comprises deactivating the output drivers by a test unit which is testing the circuit component to be tested.

23. The method according to claim 22, which comprises:
providing a device for deactivating the output drivers;
selecting the device from the group consisting of a logic unit and a selection circuit;
using the device to ensure:
that during normal operation of the circuit component to be tested, the output drivers are controlled based upon an enable signal which is supplied to the circuit component to be tested by a bus control device which controls the bus, and
that during testing of the circuit component to be tested, the output drivers are controlled based upon a test control signal which the test unit supplies to the circuit component to be tested.

24. The method according to claim 23, which comprises using the logic unit to provide an output signal resulting from a logical combination of the enable signal and a test control signal.

25. The method according to claim 23, which comprises providing the output drivers with control connections, and forming the selection circuit by a multiplexer which selectively connects the enable signal or the test control signal to the control connections of the output driver.

26. The method according to claim 20, which comprises signaling a bus control device which controls the bus that the circuit component to be tested is undergoing a test.

27. The method according to claim 26, which comprises using the bus control device to ensure that, during testing of the circuit component to be tested, the bus is terminated by a device selected from the group consisting of the bus control device and one of the others of the plurality of circuit components.

28. The method according to claim 20, wherein the operation performed by the circuit component to be tested, during the testing thereof, is outputting data to the bus that is other than the data which would be output to the bus during normal operation, and selecting the data output to the bus from the group consisting of infrequently changing data and non-changing data.

29. The method according to claim 28, which comprises:
selecting a device from the group consisting of a logic unit and a selection circuit;
using the device to ensure:
that during normal operation of the circuit component to be tested, data that actually needs to be output to the bus are output to the bus, and
that during testing of the circuit component to be tested, the data outputted to the bus is from a test unit carrying out the testing of the circuit component to be tested.

30. The method according to claim 29, which comprises:
selecting the device to be the logic unit;
constructing the logic unit to provide an output signal resulting from a logical combination of the data which would be output to the bus during normal operation and a test control signal; and
using the test control signal, by the test unit, to indicate that the test unit is currently testing the circuit component to be tested.

31. The method according to claim 29, which comprises:
selecting the device to be the selection circuit;
providing the circuit component to be tested with output drivers for outputting data to the bus;
forming the selection circuit by a multiplexer which selectively connects to the output drivers either the data which would be output to the bus during normal operation or the test control signal supplied by the test unit.

32. The method according to claim 29, which comprises:
providing the circuit component to be tested with output drivers for outputting data to the bus; and
providing each one of the output drivers with a device that is selected from the group consisting of a logic unit and a selection circuit.

33. The method according to claim 32, wherein each one of the output drivers receives an input signal that is an output signal of the respectively provided device.

34. The method according to claim 20, wherein:
the circuit component to be tested is provided with output drivers having output connections;
the operation performed by the circuit component to be tested, during the testing thereof, is outputting data to the bus that is other than the data which would be output to the bus during normal operation; and
the outputted data are supplied to points situated between the output connections of the output drivers and the bus.

35. The method according to claim 34, which comprises providing a switching device for supplying the outputted data to the points situated between the output connections of the output drivers and the bus.

36. The method according to claim 35, which comprises controlling the switching device with a logic unit.

37. The method according to claim 36, wherein the logic unit provides an output signal resulting from a logical combination of an enable signal and a test control signal.

38. The method according to claim 36, wherein the switching device, when turned on, connects the points situated between the output connections of the output drivers and the bus to at least one point which has a predetermined potential.

* * * * *